United States Patent
Tsai et al.

(10) Patent No.: US 6,650,008 B2
(45) Date of Patent: Nov. 18, 2003

(54) STACKED SEMICONDUCTOR PACKAGING DEVICE

(75) Inventors: Chen-Jung Tsai, Hsin-Chu (TW); Jui-Chung Lee, Yun-Lin (TW); Chih-Wen Lin, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/105,155

(22) Filed: Mar. 26, 2002

(65) Prior Publication Data

US 2003/0183917 A1 Oct. 2, 2003

(51) Int. Cl.[7] .......................... H01L 23/02; H01L 23/34; H01L 23/48; H01L 23/52
(52) U.S. Cl. .................. 257/686; 257/777; 257/723; 257/690; 257/784; 257/786; 257/778; 257/737
(58) Field of Search ................................ 257/686, 777, 257/784, 690, 778, 723

(56) References Cited

U.S. PATENT DOCUMENTS

| | | | | |
|---|---|---|---|---|
| 5,012,323 A | | 4/1991 | Farnworth | |
| 5,229,960 A | * | 7/1993 | De Givry | 365/63 |
| 5,721,452 A | | 2/1998 | Fogal et al. | |
| 5,760,478 A | * | 6/1998 | Bozso et al. | 257/777 |
| 5,808,878 A | * | 9/1998 | Saito et al. | 361/818 |
| 6,084,308 A | * | 7/2000 | Kelkar et al. | 257/777 |

* cited by examiner

Primary Examiner—Steven Loke
Assistant Examiner—Nitin Parekh

(57) ABSTRACT

A stacked semiconductor packaging device consists of at least a stacked multi-chip device comprising a substrate. A first chip has a back surface faced towards the substrate and an active surface comprising a plurality of bonding pads which have a first set of elongate conductors connected to the substrate. A second chip has another back surface and another active surface comprising a plurality of bonding pads which have a second set of elongate conductors connected to the substrate. The active surface of the second chip is faced towards the active surface of said first chip and is stacked atop the first chip so as to expose all of the bonding pads. The face-to-face arrangement of the first chip and the second chip can reduce the whole packing height.

25 Claims, 8 Drawing Sheets

STACKED SEMICONDUCTOR PACKAGING DEVICE

BACKGROUND OF THE INVENTION

1. Field of the Invention

The invention relates to a stacked semiconductor packaging device, and more particularly relates to stacked multi-chip packaging device.

2. Description of the Prior Art

Recent years, semiconductor devices are constructed on the same wafer. When the devices are sawed into individual rectangular units, each takes the form of an integrated circuit (IC) chip. In order to interface a chip with other circuitry, normally it is mounted on a lead-frame chip paddle or a multi-chip module substrate.

In many cases, multi-chip devices can be fabricated faster and more cheaply than a corresponding single IC which incorporates the same or different functions. Current multi-chip module construction typically consists of a printed circuit board substrate to which a series of separate components are directly attached. This technology is advantageous because of the increase in circuit density achieved. With increased density comes improvements in signal propagation speed and overall device weight. While integrated circuit density increases at a significant rate, the interconnection density has become a significant limiting factor in the quest for miniaturization.

U.S. Pat. No. 5,012,323 discloses a pair of rectangular integrated-circuit dice mounted on opposite sides of the lead-frame. An upper, smaller chip is back-bonded to the upper surface of the lead fingers of the lead-frame via an adhesively coated, insulated film layer. The lower, slightly larger chip is face-bonded to the lower surface of the lead extensions within the lower lead-frame chip-bonding region via a second, adhesively coated, insulating, film layer. The wire-bonding pads on both the upper chip and the lower chip are interconnected with the ends of their associated lead extensions by gold or aluminum wire. The lower chip needs to be slightly larger for accessibility to the chip pads from above allowing gold wire connections to the lead extensions or fingers.

U.S. Pat. No. 5,721,452 discloses an offset chip stacked arrangement with at least one upper level chip having a width which is less than the distance separating the opposing bonding pads of the underlying chip. The upper chip is suspended above the lower chip on one or more pillars and rotated within a plane parallel to the lower chip through an angle. Once the dice are fixed in this manner, the entire assembly is subjected to the wire bonding process with all of the bonds being made in the same step.

SUMMARY OF THE INVENTION

It is one object of the present invention to provide a stacked multi-chip device. The stacked multi-chip device consists of chips with face-to-face stacked arrangement for reducing the whole stacked height.

It is another object of the present invention to provide an assembly of semiconductor devices. The assembly of semiconductor devices has stacked chips with cross arrangement without interference of bonding pads with each another.

It is further object of the present invention to provide a stacked semiconductor packaging device. The stacked semiconductor packaging device has the minimum overall height of the assembly, and has facilitating ease and efficiency of wire bonding.

In the present invention, a stacked semiconductor packaging device consists of at least a stacked multi-chip device comprising a substrate. A first chip has a back surface faced towards the substrate and an active surface comprising a plurality of bonding pads which have a first set of conductors connected to the substrate. A second chip has another back surface and another active surface comprising a plurality of bonding pads which have a second set of conductors connected to the substrate. The active surface of the second chip is faced towards the active surface of said first chip and is, offset or rotated, stacked atop the first chip so as to expose all of the bonding pads. The face-to-face arrangement of the first chip and the second chip can reduce the whole packing height.

BRIEF DESCRIPTION OF THE DRAWINGS

A better understanding of the invention may be derived by reading the following detailed description with reference to the accompanying drawings wherein.

DESCRIPTION OF THE PREFERRED EMBODIMENT

While the invention is described in terms of a single preferred embodiment, those skilled in the art will recognize that many devices described below can be altered as well as other substitutions with same function and can be freely made without departing from the spirit and scope of the invention.

Furthermore, there is shown a representative portion of video signals of the present invention in enlarged. The drawings are not necessarily to scale for clarify of illustration and should not be interpreted in a limiting sense. Furthermore, the present invention can be applied on various multi-chip devices or packages.

In the present invention, a stacked semiconductor packaging device consists of at least a stacked multi-chip device comprising a substrate. A first chip has a back surface faced towards the substrate and an active surface comprising a plurality of bonding pads which have a first set of elongate conductors connected to the substrate. A second chip has another back surface and another active surface comprising a plurality of bonding pads which have a second set of elongate conductors connected to the substrate. The active surface of the second chip is faced towards the active surface of said first chip and is stacked atop the first chip so as to expose all of the bonding pads. The face-to-face arrangement of the first chip and the second chip can reduce the whole packing height.

Figure 1:
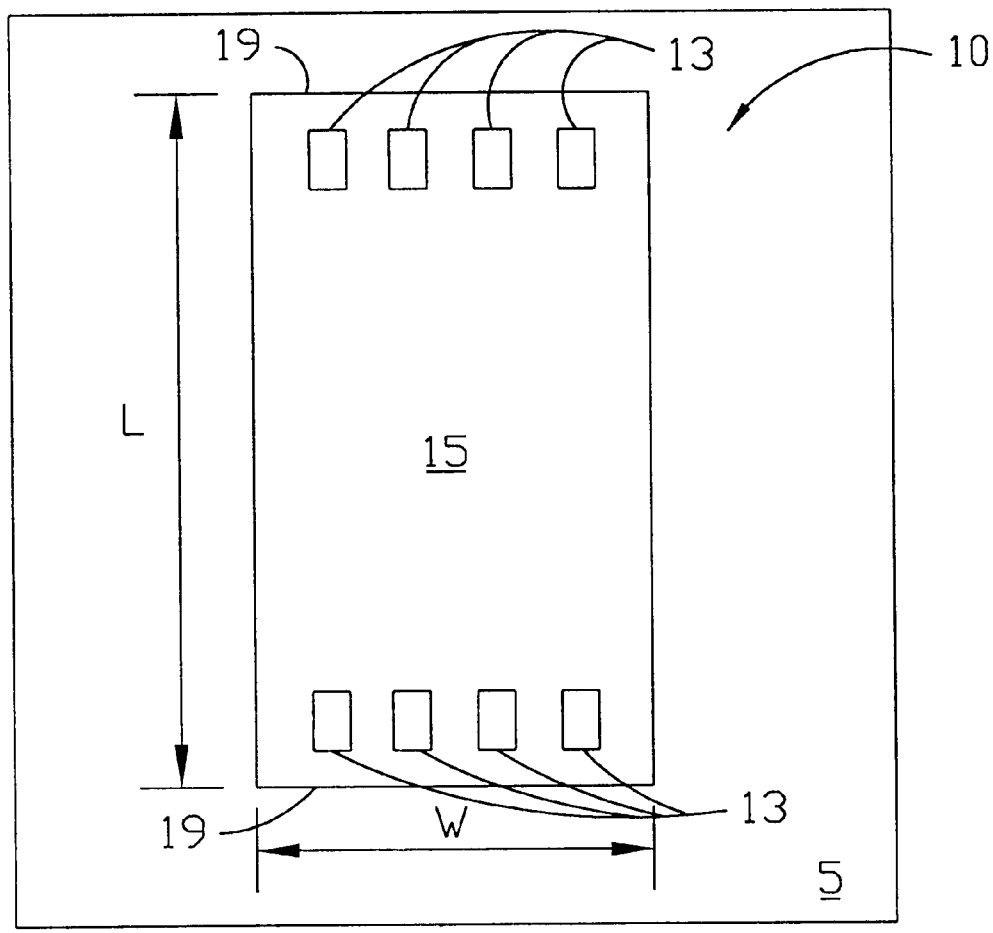
FIG. 1 is a plane schematic diagram illustrating a lower chip and a substrate in accordance with the present invention.

The multi-chip device of the first embodiment is comprised of a substrate 5 which includes one or more Z-direction multi-chip stacks. For the purposes of this explanation, depicted in FIG. 1, the substrate 5 lies generally in the XY plain and the chip stacks extend upwardly parallel with the Z axis. However, it should be noted that the invention is not limited to this orientation and the coordinate system could describe stacks extending in the X or Y directions, as well as any other direction. Consequently, directional and position descriptors such as upper, lower, above, below, etc. are adopted merely for the convenience of illustration and explanation and are not intended to limit the orientation or scope of the invention.

Referring first to a lower first chip 10 has a back surface faced downward to the substrate 5 and a bonding surface (active surface) 15 upward. The back surface of the lower first chip 10 can be affixed to the substrate 5 with a liquid non-conductive material or a solid conductive film. Furthermore, the bonding surface 15 includes a plurality of bonding pads 13 generally lay adjacent opposing side edges 19. In the first embodiment, the geometry of the lower first chip 10 is rectangular which has a length "L" much more than a width "W" including side edges 19.

Figure 2A:
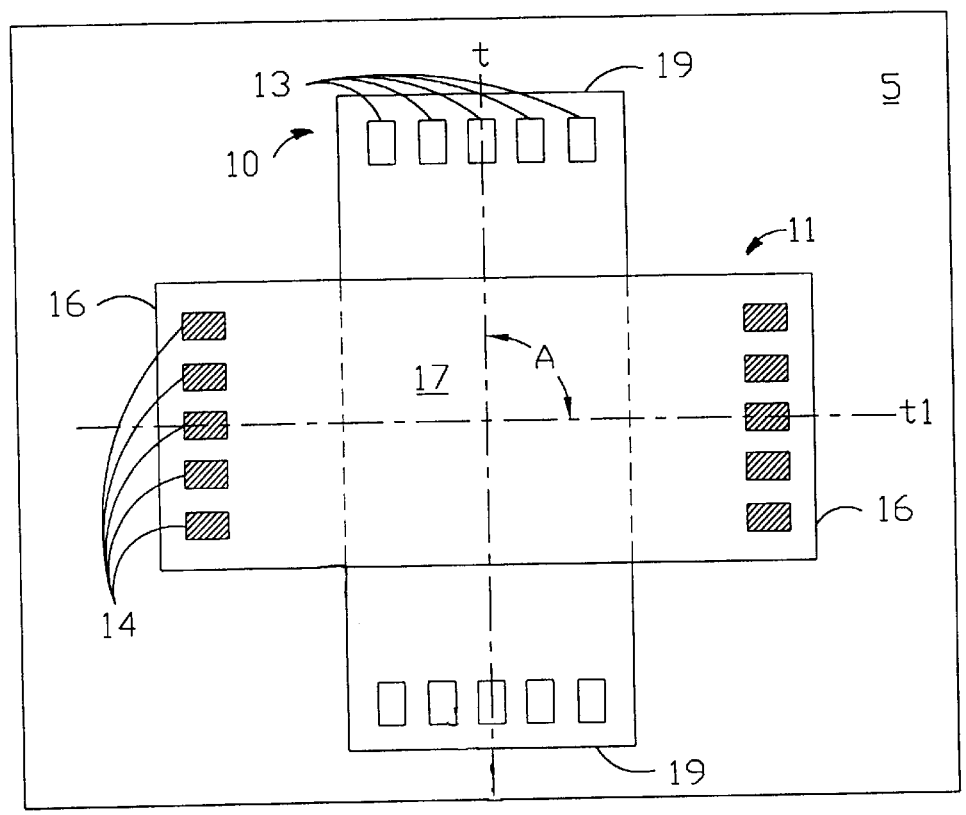
FIGS. 2A–2D are the first plane schematic diagrams illustrating the various stacked arrangements of a lower chip and an upper chip in accordance with the present invention.

Depicted in FIGS. 2A–2D are various arrangements of the first embodiment. As shown in FIG. 2A, an upper second chip 11 also has a back surface 17 faced upward and a bonding surface downward to the lower first chip 10. Thus, a plurality of bonding pads 14 of the upper second chip 11 are downward faced to the substrate 5 and generally lay adjacent opposing side edges 16. On the other hand, the upper second chip 11 has dimensions and geometry similar the lower first chip 10. The width of the upper second chip 11 must be less than or equal to the length "L" of the lower first chip 10. Furthermore, the upper second chip 11 is angularly with respect to the lower first chip 10 at a rotated angle "A" which is sufficient to insure that the upward bonding pads 13 and downward bonding pads 14 are not interfered with each another. The rotated angle "A" represents the angle between the longitudinal centerline "t" of the lower first chip 10 and the longitudinal centerline "t1" of the upper second chip 11. The angular rotation of the upper second chip 11 occurs in a plane which is generally parallel to the upward bonding surface 15 of the lower first chip 10. Thus, for the lower first chip 10, two edge portions included the upward bonding pads 13 are exposed and separated each other by the upper second chip 11. For upper second chip 11, as well as the lower first chip 10, includes two edge portions having the downward bonding pads 14 exposed and separated each other.

Figure 2B:
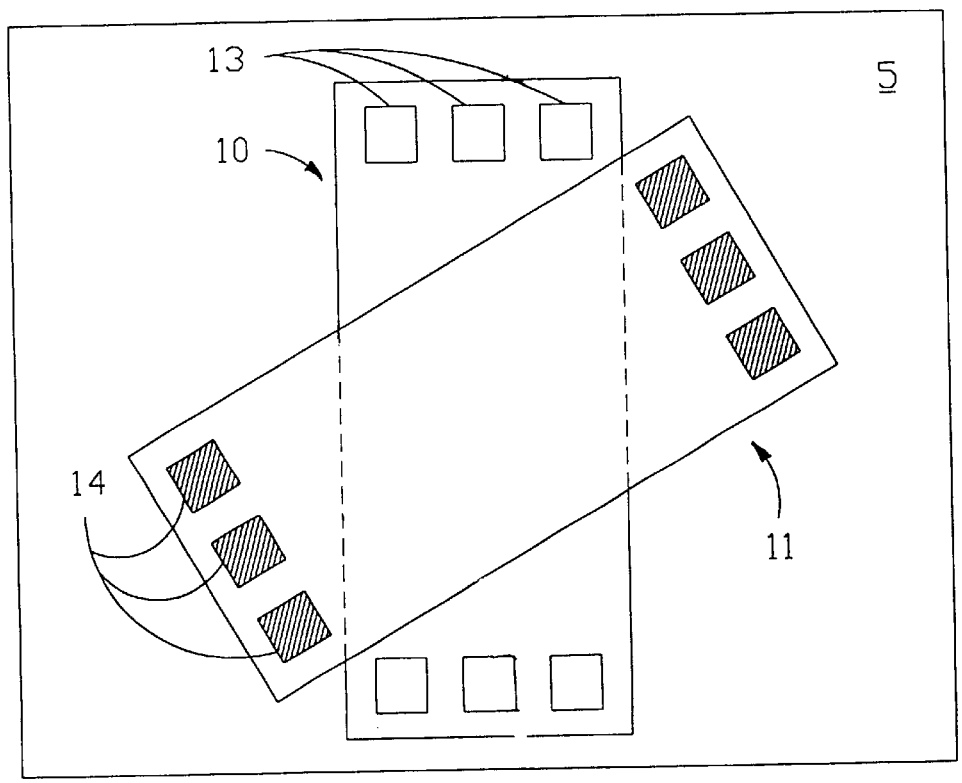

As shown in FIG. 2B, the upper second chip 11 is rotated with an angular offset for any specific design or requirement. Of course, the upward bonding pads 13 of the lower first chip 10 and the downward bonding pads 14 of the upper second chip 11 are insured not to interfere with each another.

Figure 2C:
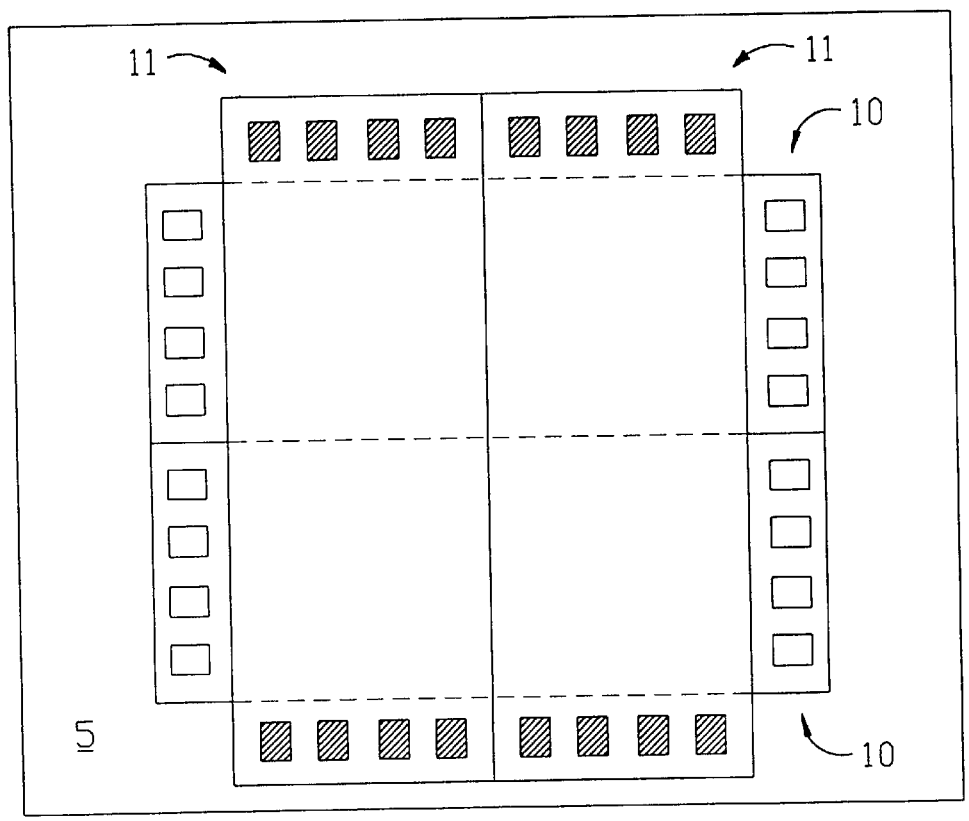

As shown in FIG. 2C, there are multitudes of lower first chips 10 arranged adjacent to each other on the substrate 5 and multitudes of upper second chips 11 arranged adjacent to each other on those lower first chips 10. The width summation of the upper second chips 11 is less than the length of any one of the lower first chips such that the bonding pads of the lower first chips aren't interfered with ones of the upper second chips 11. Similar to the first embodiment of the present invention, all lower first chips 10 have back surfaces faced downward to the substrate 5 and bonding surfaces upward. All upper second chips 11 have back surfaces upward and bonding surfaces faced downward to those lower first chips 10. Furthermore, these lower first chips 10 and upper seconds chips 11 have dimensions and geometries as same as ones of the first embodiment. For interconnection between a plurality of chips, there are two methods applied. If there is no signal transmission between two chips on the different stack levels, for example, a thin sheet of an insulating material is inserted between the bonding surfaces (active surfaces) of the two chips. On the other hand, if there is signal transmission between the two chips on the different stack levels, redistribution or flip chip technology combined with SMT technology is applied on the interconnection between the two chips.

Figure 2D:
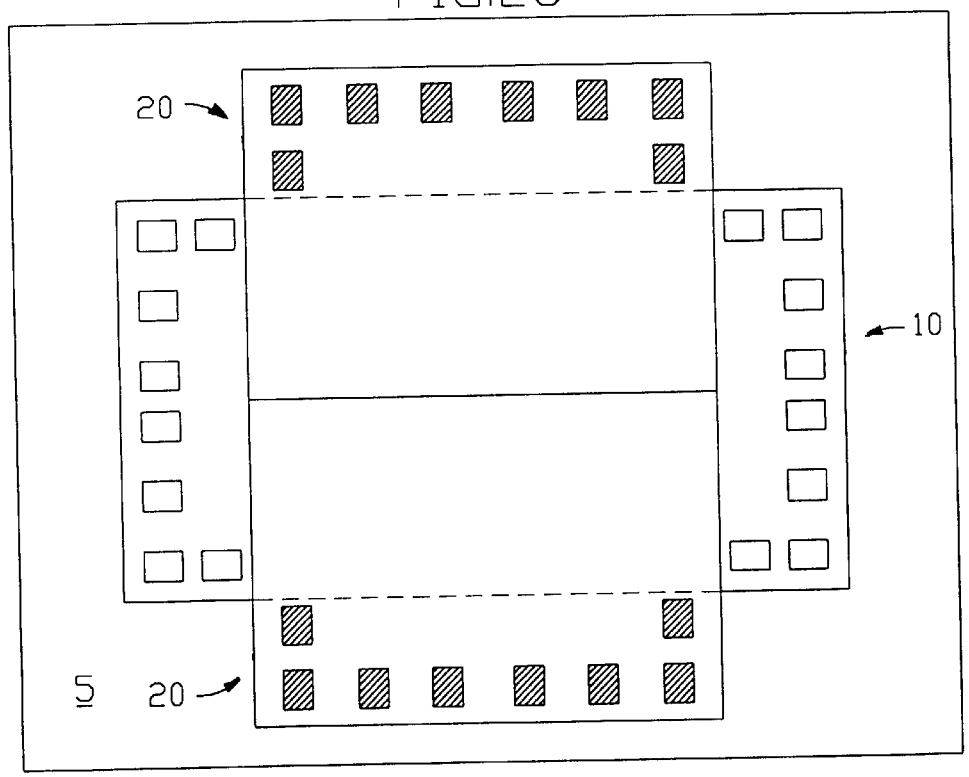

Next, the lower first chip 10 in FIG. 2D is rectangular such as ones in FIGS. 2A–2C. Multitudes of upper second chips 20 are adjacent to each other and stacked on the lower first chip 10. The upper second chips 20 in FIG. 2D have lengths smaller than the length of the lower first chip 10 such that the bonding pads of the lower first chip 10 aren't interfered with ones of the upper second chips 20. The upper second chips 20 also have bonding surfaces faced downward to the lower first chip 10. Thus, the chip arrangements of the present invention are not limited on the chips with same dimensions or geometries as long as the bonding pads of any chip aren't interfered with those of the other chips.

Figure 3A:
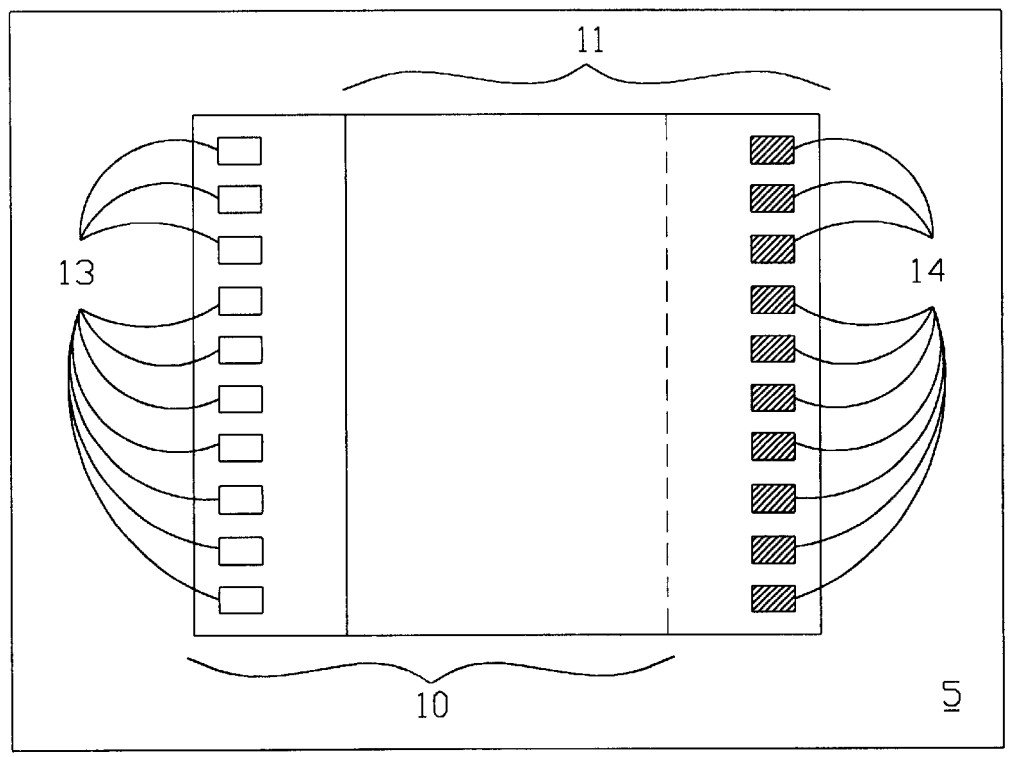
FIGS. 3A–3C and FIG. 4 are plane schematic diagrams illustrating the are the second plane schematic diagrams illustrating the various stacked arrangements of a lower chip and an upper chip in accordance with the present invention.
Figure 3B:
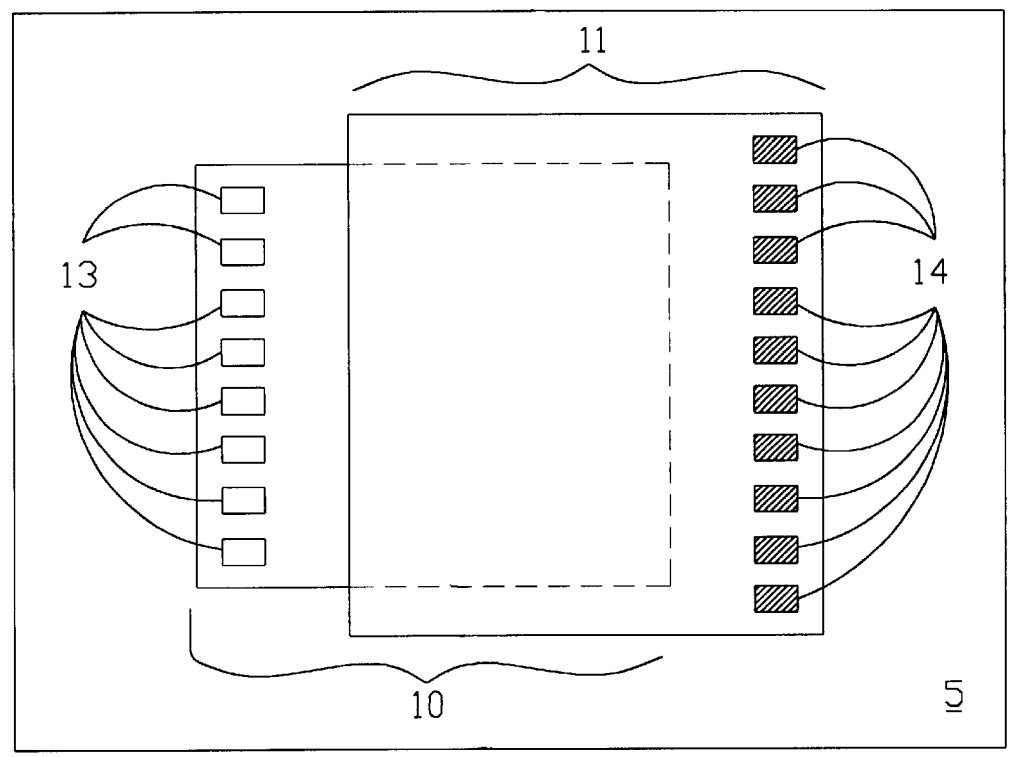
Figure 3C:
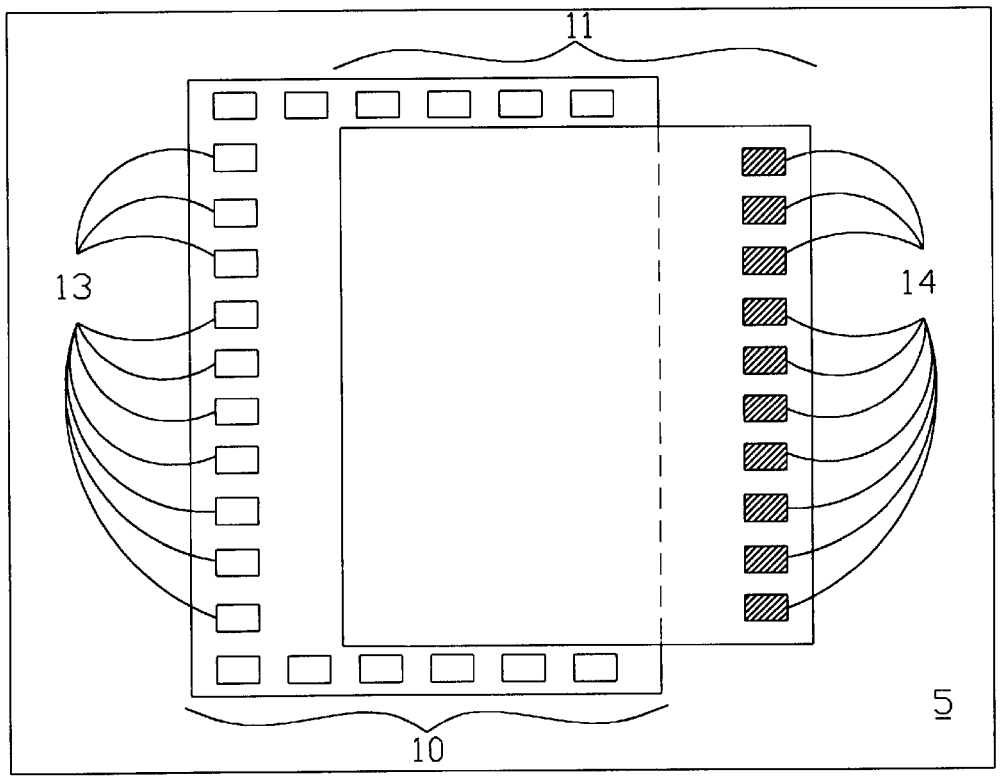

Depicted in FIGS. 3A–3C is the second embodiment of the present invention, wherein the upper second chip 11 is offset in one direction from the lower first chip 10 on the substrate 5. Depicted in FIG. 3A, the geometry and dimension of the upper second chip 11 are similar to those of the lower first chip 10. The upper second chip 11 is offset such that the edge portion of the lower first chip 10 is exposed. The exposed edge portion of the lower first chip 10 comprises the upward bonding pads 13 and is rectangular. The upper second chip 11 with a same dimension as the lower first chip 10, also be exposed the rectangular edge portion comprising the downward bonding pads 14.

In FIG. 3B, the dimension of the upper second chip 11 is larger than the dimension of the lower first chip 10, such that the exposed edge portion of the upper second chip 11 is U-shaped and the exposed edge portion of the lower first chip 10 is rectangular. The upward bonding pads 13 are distributed on the rectangular exposed edge portion of the lower first chip 10 and the downward bonding pads 14 are on the U-shaped exposed edge portion of the upper second chip 11.

FIG. 3C is shown another arrangement for two stacked chips with the different dimensions. The lower first chip 10 is exposed a U-shaped edge portion on which the bonding pads 13 are distributed. The upper second chip 11 is exposed a rectangular edge portion on which the bonding pads 14 are distributed.

Figure 4:
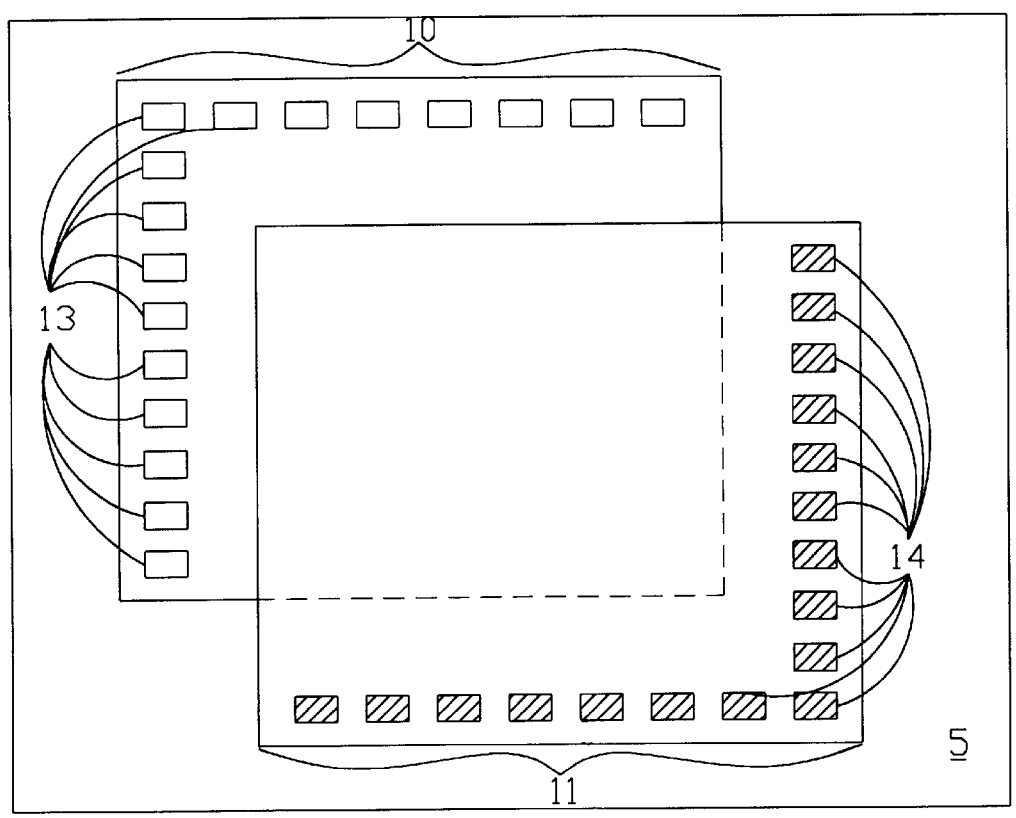

FIG. 4 is the third embodiment in which the upper second chip 11 is offset in two directions from the lower first chip 10. The lower first chip 10 is exposed a L-shaped edge portion on which the bonding pads 13 are distributed. The upper second chip 11 is also exposed another L-shaped edge portion on which the bonding pads 14 are distributed.

Figure 5A:
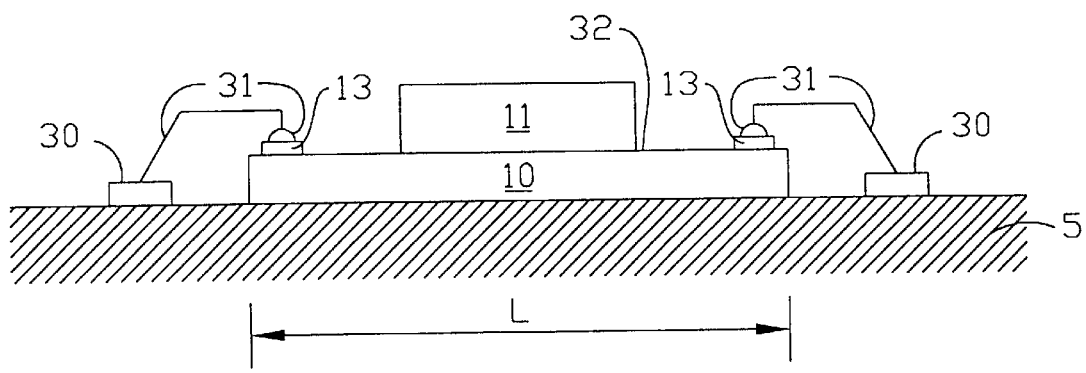
FIGS. 5A–5C are cross-sectional schematic diagrams illustrating the connection method of a lower chip with a substrate in accordance with the present invention.
Figure 5B:
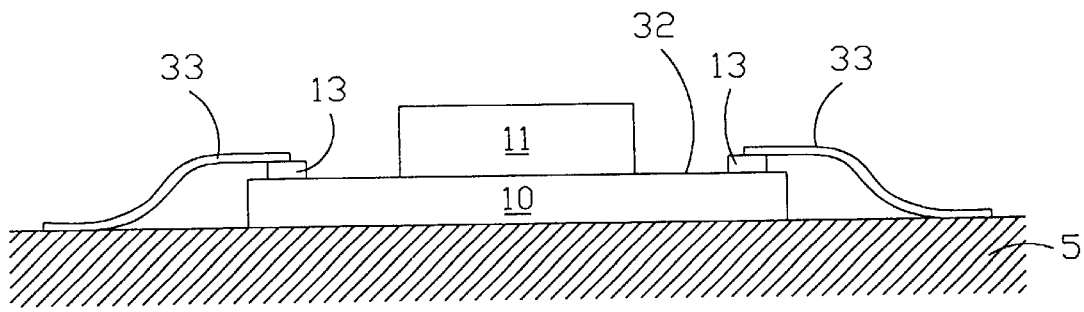
Figure 5C:
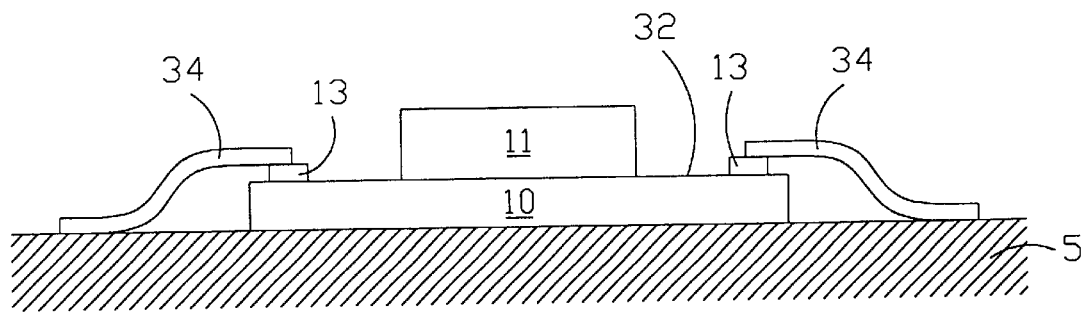

FIGS. 5A–5C are schematically cross-sectional views illustrating the interconnection methods of the lower chip in accordance with the first embodiment in FIG. 2A. It is note that the interconnection methods are also applied on other embodiments of the present invention, such as ones mentioned in FIGS. 2B–4. On the other hand, FIGS. 5A–5C mainly illustrate the interconnection methods of the lower chip, thus the interconnection methods of the upper chip aren't shown therein for simplicity.

In the present invention, the bonding pads 13 of the lower first chip 10 are connected to the substrate 5 by multitudes of conductors. The conductors are made of rigid or flexible materials and implemented by suitable interconnecting methods. Shown in FIG. 5A, multitudes of metal wires 31 are connected between the bonding pads 13 on the bonding surface 32 and the pads 30 on the substrate 5 by the method of wire bonding attachment. For reducing the whole packing height, the arc height of metal wires 31 would be controlled within the height of the upper second chip 11.

Shown in FIG. 5B, multitudes of flexible conductors 33, such as soft print circuit board, are connected between the bonding pads 13 on the bonding surface 32 and the pads 30 on the substrate 5 by the interconnection method of tape automatic bonding (TAB) or tape carrier packaging (TCP). Shown in FIG. 5C, multitudes of lead frames 34 are connected between the bonding pads 13 on the substrate 5 by the interconnection method of lead-frame attachment.

FIGS. 6A–6D are schematically cross-sectional views illustrating the interconnection methods of the upper chip in accordance with the first embodiment in FIG. 2A. It is also note that the interconnection methods are also applied on other embodiments of the present invention, such as ones mentioned in FIGS. 2B–4. On the other hand, FIGS. 6A–6D mainly illustrate the interconnection methods of the upper chip, thus the interconnection methods of the lower chip aren't shown therein for simplicity.

Figure 6A:
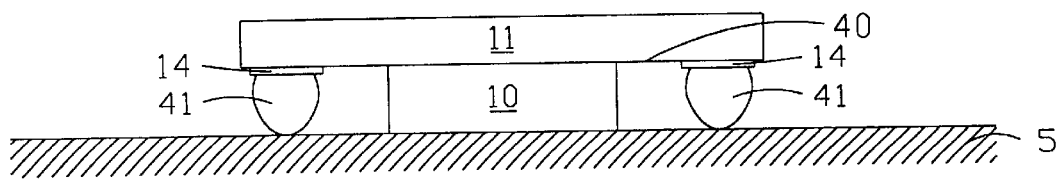
FIGS. 6A–6D are cross-sectional schematic diagrams illustrating the connection method of an upper chip with a substrate in accordance with the present invention.
Figure 6B:
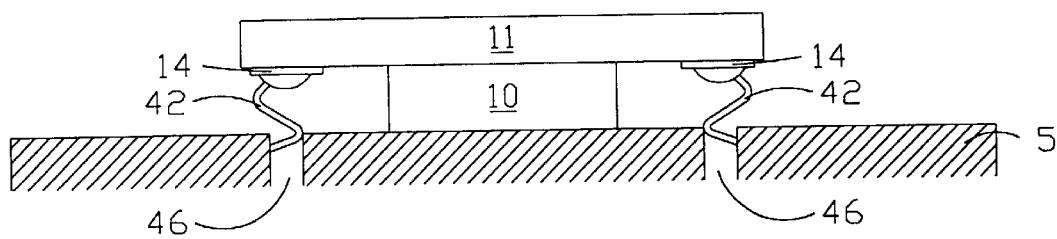

In the present invention, the-downward bonding pads 14 of the upper second chip 11 are connected to the substrate 5 by multitudes of conductors. The conductors are made of rigid or flexible materials and implemented by suitable interconnecting methods. For the upper second chip 11, shown in FIG. 6A, multitudes of solder balls 41 are affixed to both the bonding pads 14 of the upper second chip 11 and the substrate 5 by the interconnection method of solder ball technology. The lower first chip 10 can be polished thinner to a thickness suitable to solder balls under consideration of successful manufacture. As shown in FIG. 6B, multitude of bonding pads 42 are affixed to the bonding pads 14 and the conductive via 46 in the substrate 5 by the stud-bump method of gold wire technology, such that the bonding pads have shapes similar to a springs. There is no arc height issue on the bonding types of the upper second chip 11. Thus, the whole stacked height is the height summation of total stacked chips in Z-direction.

Figure 6C:
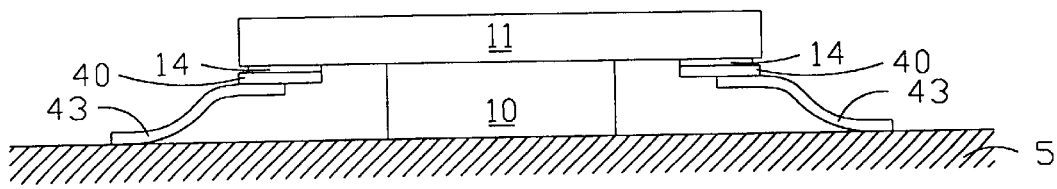
Figure 6D:
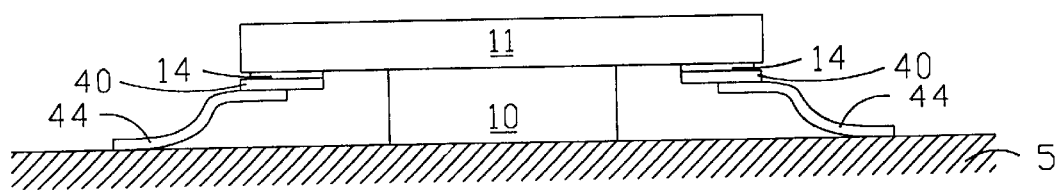

Furthermore depicted in FIG. 6C, multitudes of conductive bumps 40 and flexible conductive lines 43 are affixed to the bonding pads 14 and the substrate 5 by the interconnection method of tape automatic bonding (TAB) or tape carrier packaging (TCP) technology. The addition of bumps 40 also can improve the successful process of the interconnection besides the height reduction of the lower first chip 10. Depicted in FIG. 6D bumps 40 and leads 44 are affixed to the bonding pads 14 and the substrate 5 by the interconnection method of lead-frame attachment.

Figure 7A:
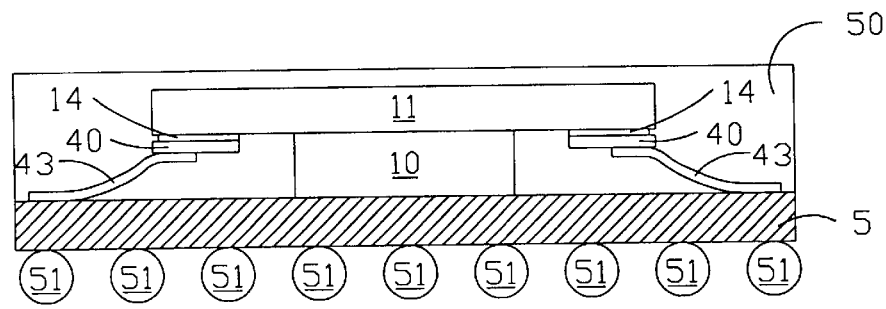
FIGS. 7A–7C are cross-sectional schematic diagrams illustrating various stacked semiconductor packaging devices in accordance with the present invention.
Figure 7B:
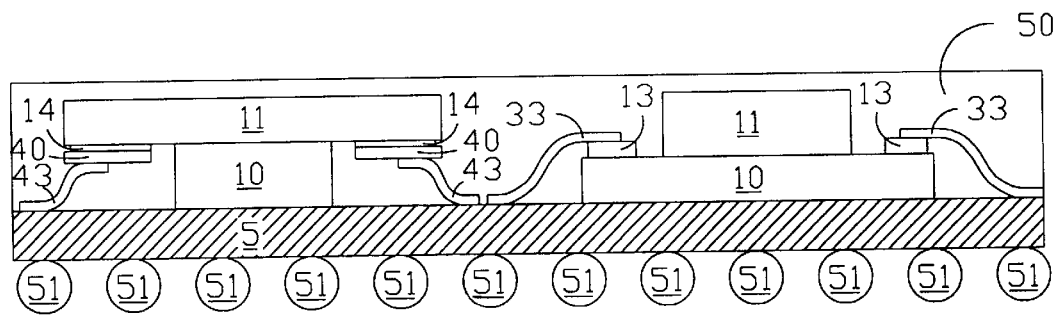
Figure 7C:
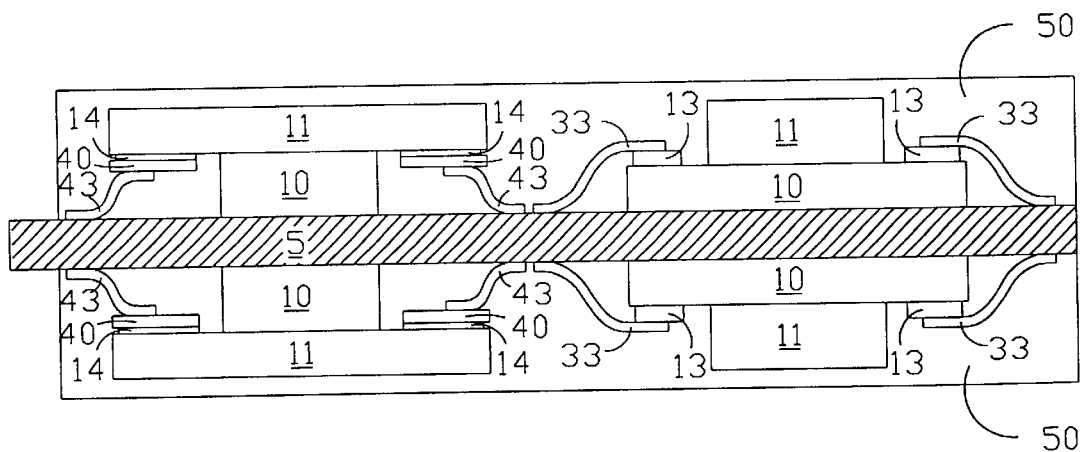

FIGS. 7A–7C are schematically cross-sectional views illustrating a variety of packaging devices in accordance with the present invention. FIG. 7A shows a stack chip scale package (CSP) in accordance with the present invention. A stack unit consists of the lower first chip 10 and the upper second chip 11, which is encapsulated on one side of the substrate 5 with molding compound 50 thereabout. The upper second chip 11 is affixed with the bumps 40 and flexible conductive lines 43 in the embodiment. The lower first chip 10 is also affixed with the flexible conductive lines in the embodiment but not shown in FIG. 7A. There are multitudes of solder balls 51 under the other side of the substrate 5. It is note that the height of the molding compound 50 on the substrate 5 can be higher or equal to the height summation of the stacked chips, thus the dimension of the whole stack CSP is reduced. Furthermore, the arrangement for the stack units on the substrate 5 can be adjustable to reduce dimension in X-Y plane. FIG. 7B shows a multi-chip package (MCP) BGA in accordance with the present invention. Multitudes of stack units are on one side of the substrate 5 and the other side of the substrate 5 includes the solder balls 51. FIG. 7C shows an extensional application of product in accordance with the present invention. Multitudes of stack units are on both sides of the substrate 5.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A stacked multi-chip device comprising:
   a substrate;
   a first chip having a first back surface affixed to said substrate and a first active surface, said first active surface comprising a plurality of first bonding pads;
   a second chip having a second back surface and a second active surface, said second active surface comprising a plurality of second bonding pads, wherein said second active surface is faced towards said first active surface of said first chip and is affixed to and stacked atop said first chip to expose both said first bonding pads and said second bonding pads;
   a first set of conductors connecting said first bonding pads with said substrate; and
   a second set of conductors connecting said second bonding pads with said substrate.

2. The stacked multi-chip device of claim 1, wherein said second chip is offset in one direction from said first chip so that a rectangular edge portion having said first bonding pads is exposed.

3. The stacked multi-chip device of claim 1, wherein said second chip is offset in two directions from said first chip so that a L-shaped edge portion having said first bonding pads is exposed.

4. The stacked multi-chip device of claim 1, wherein said second chip is rotated in a plane substantially parallel to said first active surface of said first chip, wherein two edge portions of said first chip and two edge portions of said second chip are exposed.

5. The stacked multi-chip device of claim 1, wherein said substrate is selected from the groups of a ceramic substrate, an organic substrate, or combination of above.

6. The stacked multi-chip device of claim 1, wherein said first set of conductors comprises a plurality of metal wires of wire bonding.

7. The stacked multi-chip device of claim 1, wherein said first set of conductors comprises a plurality of solder bumps combined with flexible conductive lines.

8. The stacked multi-chip device of claim 1, wherein said first set of conductors comprises a plurality of solder bumps combined with a plurality of conductive lead frames.

9. The stacked multi-chip device of claim 1, wherein said second set of conductors comprises a plurality of solder balls.

10. The stacked multi-chip device of claim 1, wherein said second set of conductors comprises a plurality of solder bumps.

11. The stacked multi-chip device of claim 1, wherein said second set of conductors comprises a plurality of solder bumps combined with a plurality of flexible conductive lines.

12. The stacked multi-chip device of claim 1, wherein said second set of conductors comprises a plurality of solder bumps combined with a plurality of conductive lead frames.

13. The stacked multi-chip device of claim 1, wherein said second set of conductors comprises a plurality of metal wires.

14. A chip-stacked device comprising:

a substrate;

at least a first chip having a first back surface affixed to said substrate and a first active surface, said first active surface comprising a plurality of first bonding pads located at a first edge portion of said first active surface;

a second chip having a second back surface and a second active surface, said second active surface comprising a plurality of second bonding pads located at a second edge portion of said second chip, wherein said second active surface is faced towards said first active surface of said first chip and is offset stacked atop said first chip to expose said first edge portion and said second edge portion;

a first set of conductors connecting said first bonding pads with said substrate; and a second set of conductors connecting said second bonding pads with said substrate.

15. The chip-stacked device of claim 14, wherein said second chip is offset in one direction from said first chip so that said first edge portion is rectangular or U-shaped.

16. The stacked multi-chip device of claim 14, wherein said second chip is offset in two directions from said first chip so that said first edge portion or said second edge portion is L shaped.

17. The chip-stacked device of claim 14, wherein said substrate is selected from the groups of a ceramic substrate, an organic substrate, or combination of above.

18. The chip-stacked device of claim 14, wherein said first set of conductors is selected from the groups of a plurality of metal wires of wire bonding, a plurality of solder bumps combined with flexible conductive lines, a plurality of solder bumps combined with a plurality of conductive lead frames, or a plurality of solder balls.

19. The chip-stacked device of claim 14, wherein said second set of conductors is selected from the groups of a plurality of solder bumps, a plurality of solder bumps combined with a plurality of flexible conductive lines, a plurality of solder bumps combined with a plurality of conductive lead frames, or a plurality of metal wires.

20. A chip-stacked device comprising:

a substrate;

at least a first chip having a first back surface affixed to said substrate and a first active surface, said first active surface comprising a plurality of first bonding pads located at at-least two first edge portions of said first active surface;

a second chip having a second back surface and a second active surface, said second active surface comprising a plurality of second bonding pads located at at-least two second edge portions of said second chip, wherein said second active surface is faced towards said first active surface of said first chip and is offset stacked atop said first chip to expose said first edge portions and said second edge portions;

a first set of conductors connecting said first bonding pads with said substrate; and a second set of conductors connecting said second bonding pads with said substrate.

21. The chip-stacked device of claim 20, wherein said second chip is between said two first edge portions.

22. The chip-stacked device of claim 20, wherein said first chip is between said two second edge portions.

23. The chip-stacked device of claim 20, wherein said substrate is selected from the groups of a ceramic substrate, an organic substrate, or combination of above.

24. The chip-stacked device of claim 20, wherein said first set of conductors is selected from the groups of a plurality of metal wires of wire bonding, a plurality of solder bumps combined with flexible conductive lines, a plurality of solder bumps combined with a plurality of conductive lead frames, or a plurality of solder balls.

25. The chip-stacked device of claim 20, wherein said second set of conductors is selected from the groups of a plurality of solder bumps, a plurality of solder bumps combined with a plurality of flexible conductive lines, a plurality of solder bumps combined with a plurality of conductive lead frames, or a plurality of metal wires.

* * * * *